(12) United States Patent
Kim

(10) Patent No.: US 8,885,433 B2
(45) Date of Patent: Nov. 11, 2014

(54) SEMICONDUCTOR DEVICE HAVING FUSE CIRCUIT

(71) Applicant: SK Hynix Inc., Gyeonggi-do (KR)

(72) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 13/717,612

(22) Filed: Dec. 17, 2012

(65) Prior Publication Data

US 2013/0279272 A1    Oct. 24, 2013

(30) Foreign Application Priority Data

Apr. 19, 2012  (KR) .................. 10-2012-0040967

(51) Int. Cl.
| | | |
|---|---|---|
| *G11C 17/18* | (2006.01) | |
| *G11C 29/02* | (2006.01) | |
| *G11C 29/00* | (2006.01) | |
| *G11C 7/10* | (2006.01) | |

(52) U.S. Cl.
CPC ............ *G11C 29/027* (2013.01); *G11C 29/785* (2013.01); *G11C 17/18* (2013.01); *G11C 7/10* (2013.01)
USPC ................... 365/225.7; 365/189.05; 365/200; 365/230.01; 365/230.08; 365/203

(58) Field of Classification Search
CPC ........... G03G 15/507; G11B 20/10009; G11C 29/027; G11C 7/10; G11C 17/18; G11C 29/785; G11C 11/40603; G11C 11/4085; G11C 11/4094; G11C 29/781
USPC ................... 365/130, 225.7, 89, 200, 189.05, 365/189.15, 203, 222, 230.01, 230.02, 365/230.06
See application file for complete search history.

(56) References Cited

U.S. PATENT DOCUMENTS

2009/0257296 A1* 10/2009 Ong et al. ..................... 365/200

FOREIGN PATENT DOCUMENTS

| KR | 1020100064158 | 6/2010 |
| KR | 1020110108715 | 10/2011 |

* cited by examiner

*Primary Examiner* — Thong Q Le
(74) *Attorney, Agent, or Firm* — IP & T Group LLP

(57) ABSTRACT

A semiconductor device includes a pulse generation circuit configured to generate an enable pulse signal, which is activated in response to an active command signal and deactivated in response to a column command signal, and a plurality of fuse circuits configured to store repair addresses for a column repair and to output stored repair addresses in response to the enable pulse signal.

9 Claims, 4 Drawing Sheets

SEMICONDUCTOR DEVICE HAVING FUSE CIRCUIT

CROSS-REFERENCE TO RELATED APPLICATION

The present application claims priority of Korean Patent Application No. 10-2012-0040967, filed on Apr. 19, 2012, which is incorporated herein by reference in its entirety.

BACKGROUND

1. Field

Exemplary embodiments of the present invention relate to a semiconductor design technology, and more particularly, to a semiconductor device having a fuse circuit.

2. Description of the Related Art

In general, as a semiconductor device including a Double Data Rate Synchronous DRAM (DDR SDRAM) becomes highly integrated, a large number of memory cells are included in one semiconductor device. If one of these memory cells fails to operate correctly, the semiconductor device may not perform a requested operation.

However, as a fabrication process technology of the semiconductor device has been developed, its operation error occurs in small number of memory cells. If a product yield is considered, it is not efficient to discard the semiconductor device due to small number of memory cells having an operation error.

In order to resolve above concern, a redundant memory cell is further installed on the semiconductor device having a normal memory cell. If the normal memory cell has an error operation, the normal memory cell is replaced with the redundant memory cell. Hereinafter, a memory cell that is replaced with the redundant memory cell is referred to as "a memory cell for repair".

Here, information, which indicate the replacement of the memory cell for repair with the redundant memory cell, is provided by a redundancy circuit. The redundancy circuit includes a plurality of fuse circuits having a programmed address information (hereinafter, referred to as "a repair address") of the memory cell for repair. Thus, the redundant memory cell instead of the memory cell for repair is accessed using a repair information signal generated from the redundancy circuit during a read operation or a write operation.

Meanwhile, a programming of a plurality of fuse circuits included in the redundancy circuit is performed using an electrical cutting method or a laser cutting process. The electrical cutting process is performed by applying an over-current to a fuse circuit to be cut. The laser cutting method is performed by blowing a fuse circuit to be cut using a laser beam. The laser cutting method is widely used in the programming of the fuse circuits because the laser cutting method is simpler than the electrical cutting method.

FIG. 1 is a block diagram illustrating a conventional redundancy circuit for a column repair.

A redundancy circuit includes a first to Nth fuse circuits 31_1 to 31_N and a column repair decision circuit 36. A number of fuse circuits may be designed based on a number of column addresses ADDR<1:N> received from an exterior. For example, if the number of column addresses ADDR<1:N> received from the exterior includes N bits, the redundancy circuit may be designed to include N fuse circuits 31_1 to 31_N.

Each of the first to Nth fuse circuits 31_1 to 31_N stores one bit of repair addresses RPR_ADDR<1:N>. The first to N fuse circuits 31_1 to 31_N will be described in detail in FIG. 2.

The column repair decision circuit 36 compares the repair addresses RPR_ADDR<1:N> received from the first to Nth fuse circuits 31_1 to 31_N with the column addresses ADDR<1:N> received from an external source. If the repair addresses RPR_ADDR<1:N> is same as the column addresses ADDR ADDR<1:N>, the column repair decision circuit 36 outputs a decision signal HIT having a high voltage level. If the repair addresses RPR_ADDR<1:N> is not same as the column addresses ADDR<1:N>, the column repair decision circuit 36 outputs a decision signal HIT having a low voltage level.

If the decision signal HIT has the low voltage level, an access operation is performed in a normal memory cell corresponding to the column addresses ADDR<1:N> received from the external source. If the decision signal HIT has the high voltage level, the access operation is performed in a redundant memory cell instead of the normal memory cell.

FIG. 2 is a detailed diagram illustrating a first fuse circuit shown in FIG. 1.

A first fuse circuit 31_1 includes a pre-charge unit 32, a first fuse unit 33_1, a second fuse unit 33_2, a transfer unit 35 and a latch unit 34.

The pre-charge unit 32 precharges a first node ND1 to a power supply voltage VDD in response to a pre-charge signal PCG_SIGB. The pre-charge signal PCG_SIGB is a signal which is deactivated from a low voltage level to a high voltage level when an active command is applied from an external source.

The first fuse unit 33_1 stores one bit of a first repair address for a column repair of a first cell mat (unit cell block). The first cell mat is activated in response to a first cell mat selection signal XMAT<1>. More specifically, the first fuse unit 33_1 establish a current path between a ground node VSS and a second node ND2 based on a state of a first fuse F1 when the first cell mat selection signal XMAT<1> is activated.

The second fuse unit 33_2 stores one bit of a second repair address for a column repair of a second cell mat. The second cell mat is activated in response to a second cell mat selection signal XMAT<2>. More specifically, the second fuse unit 33_2 establish a current path between a ground node VSS and a second node ND2 based on a state of a second fuse F2 when the second cell mat selection signal XMAT<2> is activated.

The transfer unit 35 couples the first node ND1 to the second node ND2 in response to an enable pulse signal EN_PUL. The enable pulse signal EN_PUL has a pulse width corresponding to a given period in response to the pre-charge signal PCG_SIGB.

If the first fuse circuit 31_1 is designed without the transfer unit 35, a malfunction of a fuse may occur due to a voltage difference between the first fuse F1 and the second fuse F2. For example, if the in first fuse F1 is in a cutting state and the first cell mat selection signal XMAT<1> of the first cell mat is activated after a voltage of the first node ND1 is pre-charged to the power supply voltage VDD by the pre-charge unit, a voltage of the first node ND1 is the power supply voltage VDD and a voltage of the second node is the ground voltage VSS because the current path is not established between the first node ND1 and the ground voltage VSS.

If the transfer unit 35 does not exist, the voltage difference is maintained between both ends of the first fuse F1. Thus, although the first fuse F1 is cut, the malfunction of the first fuse may occur. To resolve this concern, the transfer unit 35 is set and couples the first node ND1 to the second node ND2 during an activation period of the enable pulse signal EN_PUL.

The latch unit 34 latches a voltage of the first node ND1 and outputs a latched voltage as the first repair address RPR_ADDR<1>. When the first cell mat selection signal XMAT<1> is activated, the first repair address RPR_ADDR<1> indicates a lowest bit of a repair address for a column repair of the first cell mat. When the second cell mat selection signal XMAT<2> is activated, the first repair address RPR_ADDR<1> indicates a lowest bit of a repair addresses for a column repair of the second cell mat when the second cell mat selection signal XMAT<2> is activated.

FIG. 3 is a timing diagram illustrating an operation of the first fuse circuit 31_1 shown in FIG. 2.

The pre-charge signal PCG_SIGB is activated at a low voltage level during a pre-charge period T1 before an active command is applied. The pre-charge unit 32 precharges the first node ND1 to the power supply voltage VDD in response to the pre-charge signal having the low voltage level.

The pre-charge signal PCG_SIGB is shifted from a low voltage level to a high voltage level when the active command is applied from an external source. The enable pulse signal EN_PUL is activated at a high voltage level in response to the active command, and has an active width $T_A$ of a predetermined period.

The transfer unit 35 couples the first node ND1 to the second node ND2 in response to the enable pulse signal activated during the $T_A$ period.

As shown in FIG. 3, the first cell mat selection signal XMAT<1> is activated at a high voltage level and the second cell mat selection signal XMAT<2> is activated at a low voltage level. If the first fuse F1 is cut, the first node ND1 maintains a high voltage level because a current path is not established between the second node ND2 and the ground voltage VSS. If the first fuse F1 is not cut, a voltage of the first node ND1 is changed to a low voltage level, because a current path is established between the second node ND 2 and the ground voltage VSS.

After $T_A$ period, the enable pulse signal is deactivated at a low voltage level, and the first node ND1 is disconnected from the second node ND2. However a voltage level of the first node ND1 is maintained by the latch unit 34 during a second period T2. That is if the first fuse F1 is cut, the first node maintains a high voltage level during the second period T2, and if the first fuse F1 is not cut, the first node ND1 maintains a low voltage level during the second period T2.

The detailed description of the other fuse circuits 31_2 to 32_N is omitted since the other fuse circuits 31_2 to 32_N are similar to that of the first fuse circuit 31_1.

Furthermore, since an activation width of the enable pulse signal EN_PUL used in the first to Nth fuse circuits 31_1 to 31_N of a conventional redundancy circuit are determined by a delay circuit, the enable pulse signal EN_PUL has an influence on a process, voltage and temperature (PVT) variations.

For example, if a power supply voltage VDD having a high voltage level is supplied to a fuse circuit, the first node ND1 may be disconnected from the second node ND2 before the repair addresses RPR_ADDR<1:N> stored in the first to Nth fuse circuits 31_1 to 31_N are latched, because an activation width of the enable pulse signal EN_PUL is smaller than a predetermined width of the enable pulse signal EN_PUL. Thus, incorrect repair addresses RPR_ADDR<1:N> are output and may cause the malfunction of the redundancy circuit.

SUMMARY

Exemplary embodiments of the present invention are directed to a semiconductor device for performing a stable column repair operation irrespective of the PVT variations.

In accordance with an embodiment of the present invention, semiconductor device includes a pulse generation circuit configured to generate an enable pulse signal, which is activated in response to an active command signal and deactivated in response to a column command signal, and a plurality of fuse circuits configured to store repair addresses for a column repair and to output stored repair addresses in response to the enable pulse signal.

DETAILED DESCRIPTION

Figure 1:
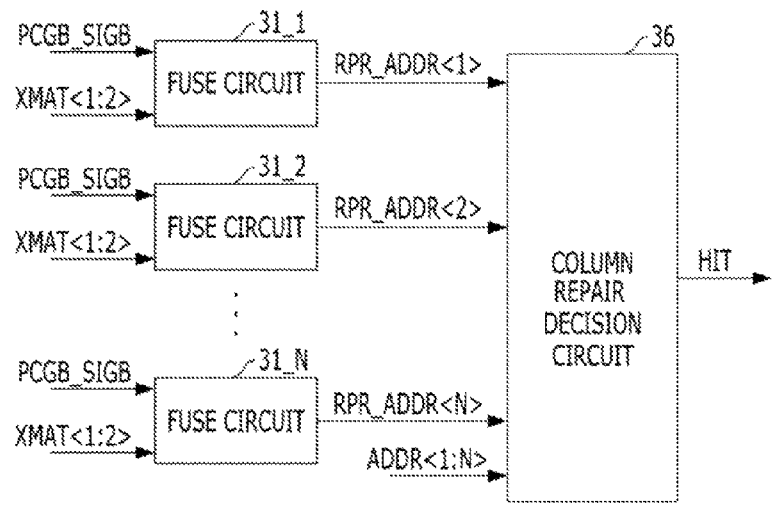
FIG. 1 is a block diagram illustrating a conventional redundancy circuit for a column repair.
Figure 2:
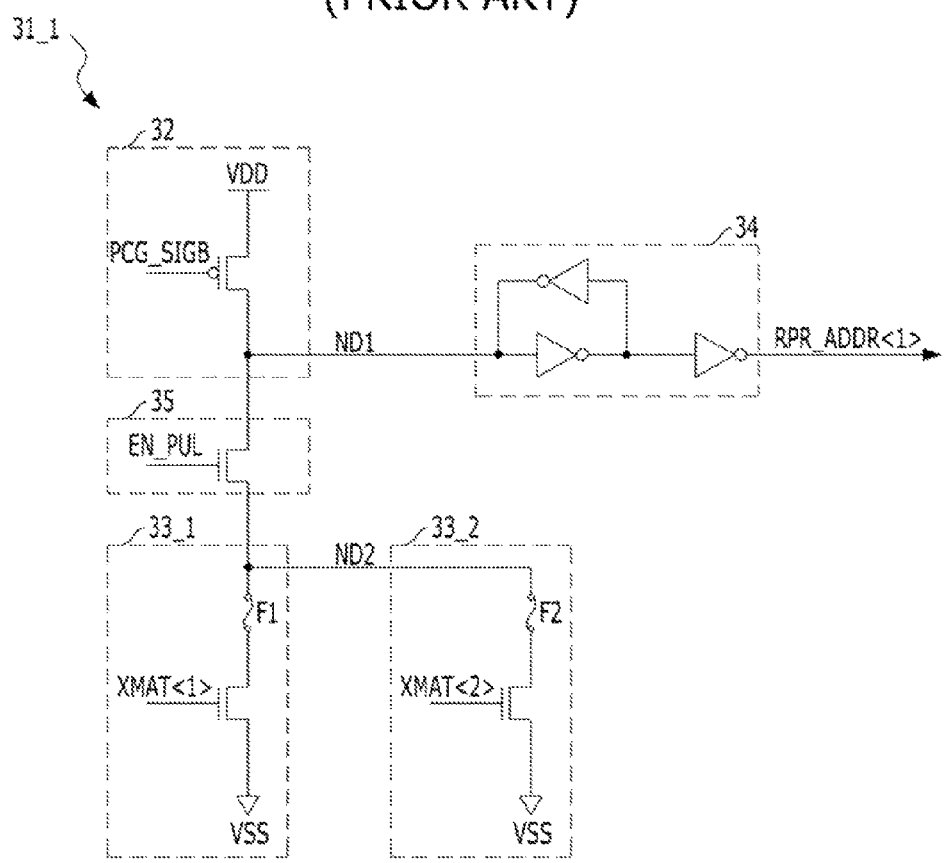
FIG. 2 is a detailed diagram illustrating a first fuse circuit shown in FIG. 1.
Figure 3:
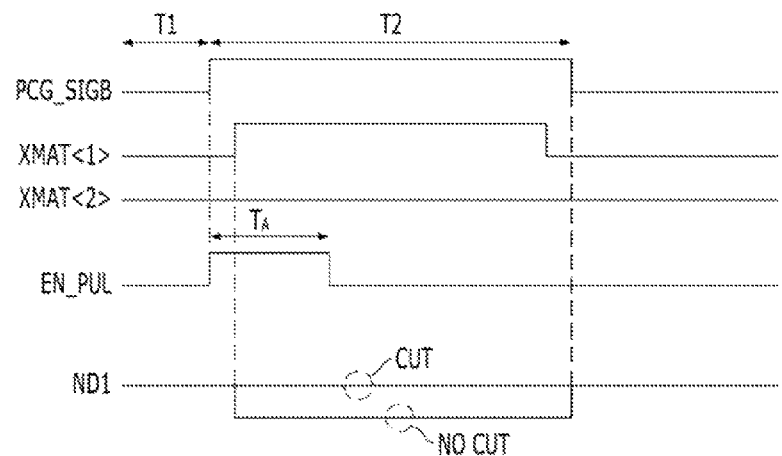
FIG. 3 is a timing diagram illustrating an operation of a first fuse circuit shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 4:
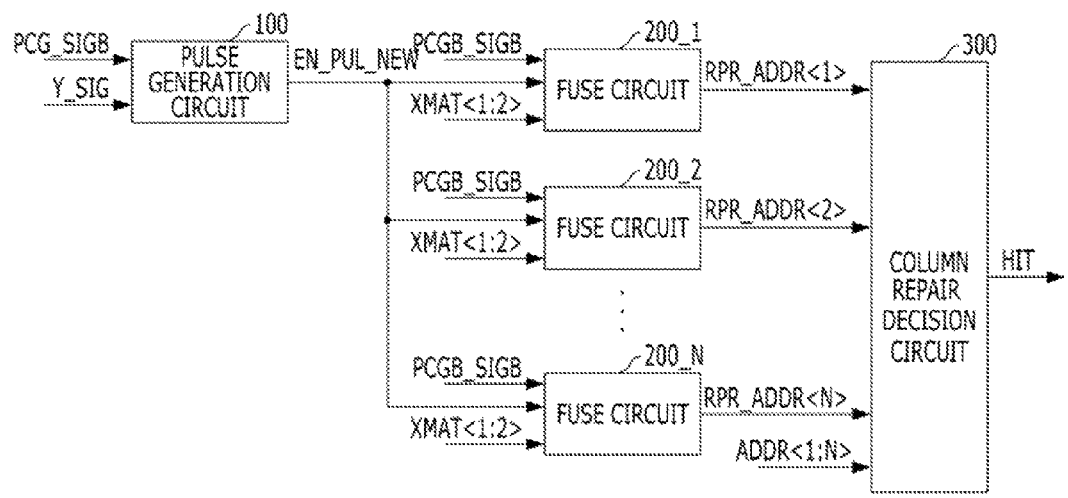
FIG. 4 is a block diagram illustrating a redundancy circuit for a column repair in a semiconductor device in accordance with an embodiment of the present invention.

FIG. 4 is a block diagram illustrating a redundancy circuit for a column repair in a semiconductor device in accordance with an embodiment of the present invention.

The redundancy circuit includes a pulse generation circuit 100, a plurality of fuse circuits 200_1 to 200_N and a column repair decision circuit 300.

The pulse generation circuit 100 receives a pre-charge signal PCG_SIGB and a column command signal Y_SIG and generates an enable pulse signal EN_PUL_NEW. The pre-charge signal PCG_SIGB is deactivated from a low voltage level to a high voltage level when an active command is applied. The column command signal Y_SIG is activated from a low voltage level to a high voltage level when a column command is input.

The pulse generation circuit 100 activates an enable pulse signal EN_PUL_NEW in response to the active command and deactivates the enable pulse signal EN_PUL_NEW in response to the column command. The column command represents a read command and a write command for a column operation of the semiconductor device. The enable pulse signal EN_PUL_NEW generated from the pulse generation circuit 100 is activated when the pre-charge signal PCG_SIGB is shifted from a low voltage level to a high voltage level in response to the active command, and is deactivated when the column command signal Y_SIG is shifted from a low voltage level to a high voltage in response to the column command.

The first to Nth fuse circuits 200_1 to 200_N receive a cell mat selection signal XMAT<1:2>, the pre-charge signal PCG_SIGB and the enable pulse signal EN_PUL_NEW. The plurality of fuse circuits 200_1 to 200_N store repair addresses RPR_ADDR<1:N> and output the repair addresses RPR_ADDR<1:N> in response to the enable pulse signal EN_PUL_NEW.

A number of fuse circuits 200_1 to 200_N may be designed corresponding to a number of column addresses ADDR<1:N> received from an external source. For example, if the column addresses ADDR<1:N> received from the external source includes N number of bits, the semiconductor device includes N number of fuse circuits 200_1 to 200_N. Each of the first to Nth fuse circuits 200_1 to 200_N stores one bit of repair addresses RPR_ADDR<1:N>, and outputs a stored one bit of repair addresses RPR_ADDR<1:N> in response to the enable pulse signal EN_PUL_NEW.

The column repair decision circuit 300 compares the repair addresses RPR_ADDR<1:N> with the column addresses ADDR<1:N> received from an external source, and generates a decision signal HIT which is activated when the repair addresses PRP_ADDR<1:N> are same as the column addresses ADDR<1:N>.

Figure 5:
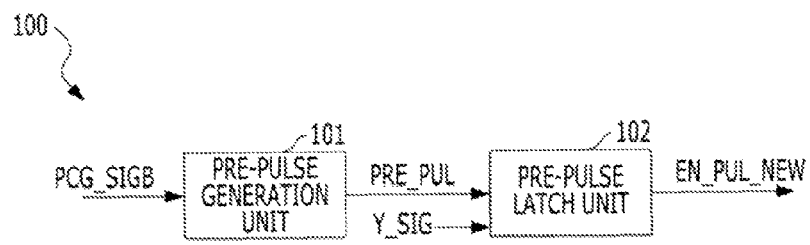
FIG. 5 is a detailed diagram illustrating a pulse generation circuit shown in FIG. 4.

FIG. 5 is a detailed diagram illustrating the pulse generation circuit 100 shown in FIG. 4.

The pulse generation circuit 100 includes a pre-pulse generation unit 101 and a pre-pulse latch unit 102.

The pre-pulse generation unit 101 generates a pre-pulse signal PRE_PUL that is activated in response to the pre-charge signal PCG_SIGB. More specifically, the pre-pulse generation unit 101 generates the pre-pulse signal PRE_PUL that is activated at a high voltage level when the pre-charge signal PCG_SIGB is shifted from a low voltage level to a high voltage level in response to the active command.

The pre-pulse latch unit 102 latches the pre-pulse signal PRE_PUL received from the pre-pulse generation unit 101 until the column command signal Y_SIG is activated to output the enable pulse signal EN_PUL_NEW as a latched pre-pulse signal. More specifically, the pre-pulse latch unit 102 latches the pre-pulse signal PRE_PUL having a high voltage level and outputs the enable pulse signal EN_PUL_NEW as the latched pre-pulse signal. Here, the pre-pulse latch unit 102 outputs the enable pulse signal EN_PUL_NEW having a low voltage level when the column command signal Y_SIG is shifted from the low voltage level to the high voltage level in response to the column command.

The enable signal EN_PUL_NEW generated from the pulse generation circuit 100 is activated when the pre-charge signal PCG_SIGB is shifted from the low voltage level to the high voltage level in response to the active command, and is deactivated when the column command signal Y_SIG is shifted from the low voltage level to the high voltage level in response to the column command.

Figure 6:
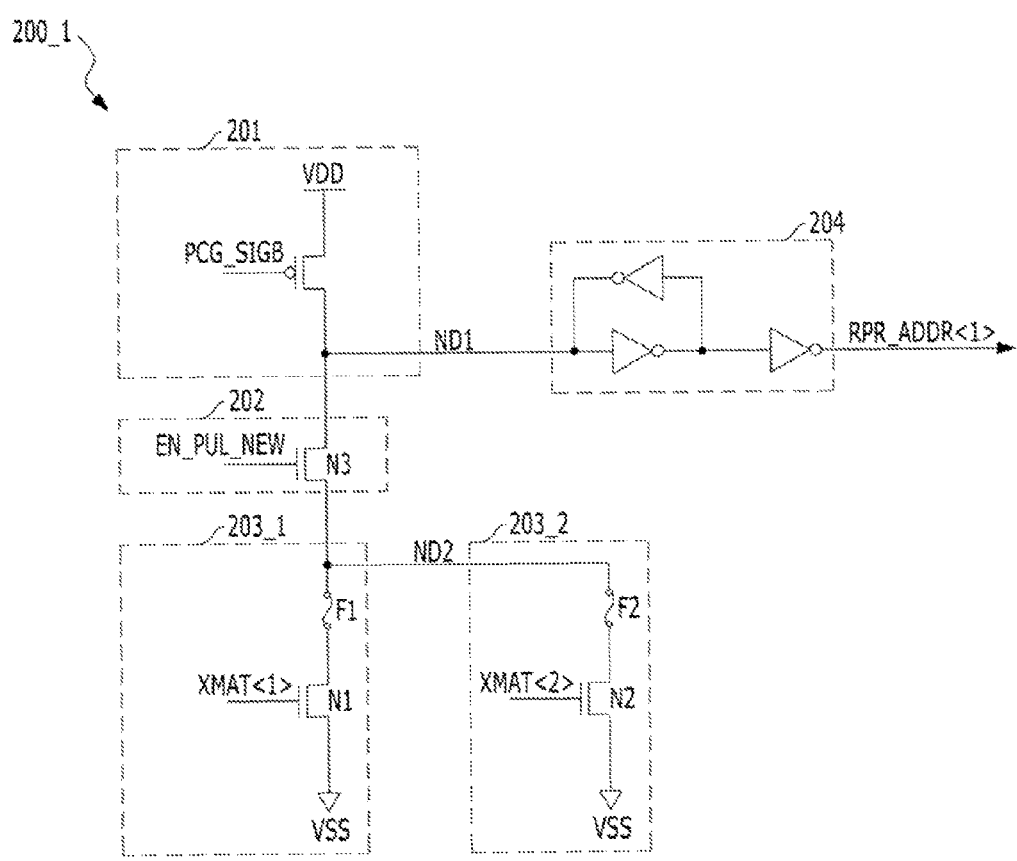
FIG. 6 is a detailed diagram illustrating a first fuse circuit shown in FIG. 4.

FIG. 6 is a detailed diagram illustrating the first fuse circuit 200_1 shown in FIG. 4.

The first fuse circuit 200_1 may store a repair address RPR_ADDR<1> of each of two cell mats. Here, first and second cell mats are activated in response to a cell mat selection signal XMAT<1:2> corresponding to the first and second cell mats, respectively.

The first fuse circuit 200_1 stores a lowest bit of a first repair address for a column repair of the first cell mat and a second lowest bit of a second repair address for the column repair of the second cell mat. The first fuse circuit 200_1 outputs the first lowest bit and the second lowest bit in response to the enable pulse EN_PUL_NEW. The first fuse circuit 200_1 includes a pre-charge unit 201, a first fuse unit 203_1, a second fuse unit 203_2, a transfer unit 202 and a latch unit 204.

The pre-charge unit 201 pre-charges a first node ND1 to a power supply voltage VDD response to the pre-charge signal PCG_SIGB. More specifically, the pre-charge unit 201 connects the first node ND1 to a power supply voltage terminal VDD and pre-charges the first node ND1 with the power supply voltage VDD when the pre-charge signal PCG_SIGB is activated at the low voltage level. The pre-charge unit 201 disconnects the first node ND1 from the power supply voltage terminal VDD and does not supply the power supply voltage VDD to the first node ND1 when the pre-charge signal PCG_SIGB is deactivated at the high voltage level in response to the active command.

The first fuse unit 203_1 stores the first lowest bit of the first repair address for a column repair of the first cell mat. More specifically, the first fuse unit 203_1 is connected to a first fuse F1 in series that is connected to the second node ND2, and includes a first switch N1 that is turned on in response to a first cell mat selection signal XMAT<1>. If the first fuse F1 is cut and the first cell mat selection signal XMAT<1> is activated, the first switch N1 is turned on but a current path is not established between the second node ND2 and the power supply voltage terminal VDD. If the first fuse F1 is not cut and the first cell mat selection signal XMAT<1> is activated, the current path is established between the second node ND2 and the power supply terminal VDD.

The second fuse unit 203_2 stores the second lowest bit of the second repair address for a column repair of the second cell mat. More specifically, the second fuse unit 203_2 is connected to the second fuse F2 in series that is connected to the second node ND2, and includes a second switch N2 that is turned on in response to a second cell mat selection signal XMAT<2>. If the second fuse F2 is cut and the second cell mat selection signal XMAT<2> is activated, the second switch N2 is turned on but a current path is not established between the second node ND2 and a ground voltage terminal VSS. If the first fuse F2 is not cut and the second cell mat selection signal XMAT<2> is activated, the current path is established between the second node ND2 and the ground voltage terminal VSS.

The transfer unit 202 transfers the first lowest bit to the first node ND1 in response to the enable pulse signal EN_PUL_NEW when the first cell mat selection signal XMAT<1> is activated, or the second lowest bit to the first node ND1 in response to the enable pulse signal EN_PUL_NEW when the second cell mat selection signal XMAT<2> is activated. More specifically, the transfer unit 202 includes a switch N3 that connects the first node ND1 to the second node ND2 in response to the enable pulse signal EN_PUL_NEW.

The latch unit 204 latches the first lowest bit or the second lowest bit that is transferred from the transfer unit 202.

Figure 7:
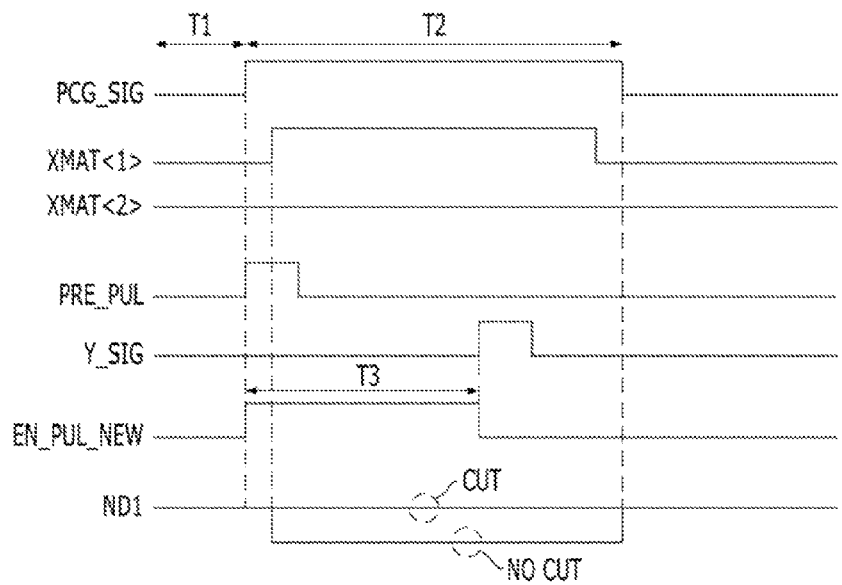
FIG. 7 is a timing diagram illustrating an operation of a first fuse circuit shown in FIG. 6.

FIG. 7 is a timing diagram illustrating an operation of the first use circuit 200_1 shown in FIG. 6.

As referring to FIGS. 5 to 7, the pre-charge signal PCG_SIGB is activated at a low voltage level during a pre-charge operation period T1 before an active command is applied. The pre-charge unit 201 connects the power supply voltage terminal VDD to the first node ND1 and pre-charges the first node ND1 with the power supply voltage VDD in response to the pre-charge signal PCG_SIGB having the low voltage level.

When the active command is applied from an external source, the pre-charge signal PCG_SIGB is deactivated from a low voltage level to a high voltage level during a second period T2. Thus, the power supply voltage VDD is not supplied to the first node ND1.

Meanwhile, the pre-pulse generation unit 101 of the pulse generation circuit 100 generates the pre-pulse signal PRE_PUL having the high voltage level in response to the pre-charge signal PCG_SIGB having the high voltage level. The pre-pulse latch unit 102 of the pulse generation circuit 100 latches the pre-pulse signal PRE_PUL and outputs the enable pulse signal as a latched pre-pulse signal before the column command signal Y_SIG is shifted from the low voltage level to the high voltage level. Here, the column command signal Y_SIG is shifted from the low voltage level to the high voltage level when the column command (e.g., a read command) is received from the external source. That is, the enable pulse signal EN_PUL_NEW, which is generated from the pulse generation circuit 100, is activated when the pre-charge signal PCG_SIGB is shafted from the low voltage level to the high voltage level, and is deactivated when the column command signal Y_SIG is shifted from the low voltage level to the high voltage level.

The transfer unit 202 of the first fuse circuit 200_1 connects the first node ND1 to the second node ND2 in response to the enabled pulse signal EN_PUL_NEW that is activated during a third period T3.

The first cell mat selection signal XMAT<1> is activated at the high voltage level and the second cell mat selection signal XMAT<2> is deactivated at the low voltage level. The first switch N1 is turned on in response to the first cell mat selection signal XMAT<1>, and connects the second node ND2 to the first voltage supply terminal PDND1 based on the state of the first fuse F1.

Here, if the first fuse F1 is cut, the second node ND2 is not connected to the ground voltage terminal VSS. That is, the first node ND1 maintains the high voltage level since the current path is not established between the first node ND1 and the ground voltage supply terminal VSS. The latch unit 204 latches the high voltage level of the first node ND1 and outputs the first repair address RPR_ADDR<1> having the high voltage level.

Furthermore, if the first fuse F1 is not cut, the second node ND2 is connected to the ground voltage supply terminal VSS. That is, the current path is established between the first node ND1 and the ground voltage supply terminal VSS, and the voltage level of the first node ND1 is shifted to the low voltage level. The latch unit 204 latches the low voltage level of the first node ND1 and outputs the repair address RPR_ADDR<1>.

Here, the repair address RPR_ADDR<1> that, is output from the first fuse circuit 200_1 is the lowest bit of the first repair address for a column repair of the first cell mat. If the column command signal (e.g., a read command) is input and the column command signal Y_SIG is shifted from the low voltage to the high voltage, the enable pulse signal EN_PUL_NEW is deactivated at the low voltage level. The transfer unit 202 of the first fuse circuit 200_1 disconnects the first node ND1 from the second node ND2 in response to the enable pulse signal EN_PUL_NEW, which has the low voltage level. Although the first node ND1 is disconnected from the second node ND2, the voltage level of the first node ND1 is maintained constantly during the second period T2. That is, if the first fuse F1 is cut, the first node ND1 maintains the high voltage level during the second period T2, and if the first fuse F1 is not cut, the first node ND1 maintains the low voltage level during the second period T2.

Meanwhile, FIG. 7 illustrates an exemplary signal waveform in a case that the first cell mat selection signal XMAT<1> is activated. However, if the second cell mat selection signal XMAT<2> is activated, the repair address RPR_ADDR<1>, which is output from the first fuse circuit 200_1 is the second lowest bit of the second repair address for the column repair of the second cell mat.

Furthermore, the operation and configuration of the other fuse circuits 200_2 to 200_N is similar to that of the first fuse circuits 200_1 except for the repair addresses RPR_ADDR<2:N> to be stored. That is, if the first cell mat selection signal XMAT<1> is activated, the repair addresses RPR_ADDR<1:N>, which are output from the N number of fuse circuits 200_1 to 200_N are the first repair addresses for the column repair of the first cell mat. If the second cell mat selection signal XMAT<2> is activated, the repair addresses RPR_ADDR<1:N>, which are output from the N number of fuse circuits 200_1 to 200_N, are the second repair addresses for the column repair of the second cell mat.

The column repair decision circuit 300 compares the column addresses ADDR<1:N> received from the exterior with the repair addresses RPR_ADDR<1:N> that are output from N number of fuse circuits 200_1 to 200_N. If the column addresses ADD<1:N> are same as the repair addresses RPR_ADDR<1:N> the column repair decision circuit 300 outputs a decision signal HIT having the high voltage level. If the column addresses ADD<1:N> are not same as the repair addresses RPR_ADDR<1:N>, the column repair decision circuit 300 outputs a decision signal HIT having the low voltage level. If the decision signal HIT has the low voltage level, an access operation is performed in a normal memory cell corresponding to the column addresses ADDR<1:N> received from the external source. If the decision signal HIT has the high voltage level, the access operation is performed in a redundant memory cell, which replaces the normal memory cell.

Figure 8:
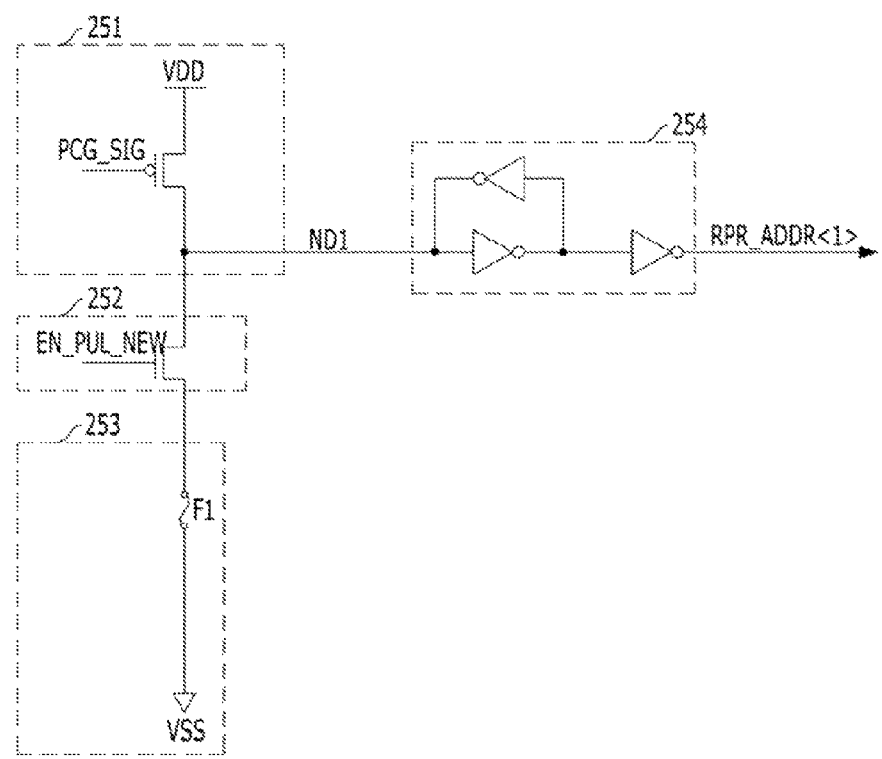
FIG. 8 is a circuit diagram illustrating a first fuse circuit in accordance with another embodiment of the present invention.

FIG. 8 is a circuit diagram illustrating a first fuse circuit in accordance with another embodiment of the present invention.

As shown in FIG. 8, the first fuse circuit may include a pre-charge unit 251, a transfer unit 252, a fuse unit 253 and a latch unit 254.

Since the pre-charge unit 251, the transfer unit 252 and the latch unit 254 are similar to or same as the pre-charge unit 201, the transfer unit 202 and the latch unit 204 shown in FIG. 6, respectively, the detailed descriptions of the pre-charge unit 251, the transfer unit 252 and the latch unit 254 are omitted.

The fuse unit 253 includes one fuse F1 and connects a first node ND1 to a ground voltage supply terminal VSS based on a state of the fuse F1. The fuse unit 253 shown in FIG. 8 is different from the fuse unit 203_1 and 203_2 of FIG. 6 in a point view that the fuse unit 253 does not receive cell mat selection signals XMAT<1:2>.

In the embodiments of the present invention, the power supply voltage terminal VDD is used as an exemplary terminal of a first voltage supply terminal and the ground voltage terminal VSS is used as an exemplary terminal of a second voltage supply terminal. That is, in another embodiment of the present invention, various internal voltage terminals may be used as the first voltage terminal and the second voltage supply terminal, respectively.

The semiconductor device in accordance with the embodiment of present invention may improve its reliability by stably performing a column repair operation irrespective of the PVT variations.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a pulse generation circuit configured to generate an enable pulse signal, which is activated in response to an active command signal and deactivated in response to a column command signal; and
a plurality of fuse circuits configured to store repair addresses for a column repair and to output stored repair addresses in response to the enable pulse signal,
wherein the pulse generation circuit comprises:
a pre-pulse generation unit configured to generate a pre-pulse signal that is activated in response to a pre-charge signal; and
a pre-pulse latch unit configured to latch the pre-pulse signal a column command signal until a column command signal is activated to output the enable pulse signal.

2. The semiconductor device of claim 1, further comprising;
a column repair decision circuit configured to compare the repair addresses with column addresses received from an external source.

3. The semiconductor device of claim 1, wherein each of the plurality of fuse circuits comprises:
a fuse unit configured to store a corresponding bit of the repair addresses;
a transfer unit configured to transfer the corresponding bit of the repair addresses stored in the fuse unit in response to the enable pulse signal; and
a latch unit configured to latch an output of the transfer unit.

4. The semiconductor device of claim 1, wherein each of the plurality of fuse circuits comprises:
a pre-charge unit configured to connect a first node to a first voltage supply terminal in response to a pre-charge signal and to precharge the first node at a first voltage level;
a fuse unit configured to have a fuse and connect a second node to a second voltage supply terminal based on a state of the fuse;
a transfer unit configured to connect the first node to the second node in response to the enable pulse signal; and
a latch unit configured to latch an output corresponding to a voltage level of the first node.

5. The semiconductor device of claim 4, wherein the first voltage supply terminal includes a power supply voltage terminal and the second voltage supply terminal includes a ground voltage terminal.

6. The semiconductor device of claim 4, wherein the pulse generation circuit comprises:
a pre-pulse generation unit configured to generate a pre-pulse signal that is activated in response to the pre-charge signal; and
a pre-pulse latch unit configured to latch the pre-pulse signal a column command signal until a column command signal is activated to output the enable pulse signal.

7. A semiconductor device comprising:
a first cell mat configured to be inactive in response to a first cell mat selection signal;
a second cell mat configured to be inactive in response to a second cell mat selection signal;
a pulse generation circuit configured to activate an enable pulse signal in response to an active command and deactivate the enable pulse signal in response to a column command;
at least one fuse circuit configured to store a first repair address for a column repair of the first cell mat and a second repair address for a column repair of the second cell mat, and output the first repair address or the second repair address in response to the enable pulse signal; and
a column repair circuit configured to perform a column repair operation using the first repair address or the second repair address which is output from the at least one fuse circuit.

8. The semiconductor device of claim 7, wherein the at least one fuse circuit comprises
a first fuse configured to store one bit of the first repair address;
a second fuse configured to one bit of the second repair address;
a transfer unit configured to transfer the first repair address having one bit, which is stored in the first fuse, to an output node in response to the enable pulse signal when the first cell mat selection signal is activated, or the second repair address having one bit, which is stored in the second fuse, to the output node in response to the enable pulse signal when the second cell mat selection signal is activated; and
a latch unit configured to latch the first repair address having one bit or the second repair address having one bit, which is transferred to the output node.

9. The semiconductor device of claim 7, wherein the at least one fuse circuit comprises
a pre-charge unit configured to connect a first node to a first voltage supply terminal in response to a pre-charge signal and pre-charge the first node to a first voltage level;
a first fuse unit configured to have a first fuse and connect a second node to a first voltage supply terminal according to a cutting state of the first fuse when the first cell mat selection signal is activated;
a second fuse unit configured to have a second fuse and connect the second node to a second voltage supply terminal according to a cutting state of the second fuse when the second cell mat selection signal is activated;
a transfer unit configured to connect the first node to the second node in response to the enable pulse signal; and
a latch unit configured to latch a voltage level of the first node.

* * * * *